(12) United States Patent
Jadidi et al.

(10) Patent No.: US 10,672,933 B2
(45) Date of Patent: Jun. 2, 2020

(54) HYBRID METAL-GRAPHENE TERAHERTZ OPTOELECTRONIC SYSTEM WITH TUNABLE PLASMONIC RESONANCE AND METHOD OF FABRICATION

(71) Applicant: UNIVERSITY OF MARYLAND, COLLEGE PARK, College Park, MD (US)

(72) Inventors: Mohammad M. Jadidi, Laurel, MD (US); Andrei B. Sushkov, College Park, MD (US); David Kurt Gaskill, Alexandria, VA (US); Michael Fuhrer, Victoria (AU); Howard Dennis Drew, Hyattsville, MD (US); Thomas E. Murphy, Bethesda, MD (US)

(73) Assignees: University of Maryland, College Park, College Park, MD (US); The Government of the United States of America, as represented by The Secretary Of The Navy, Arlington, VA (US); Monash University, Clayton (AU)

(*) Notice: Subject to any disclaimer, the term of this patent is extended or adjusted under 35 U.S.C. 154(b) by 0 days.

(21) Appl. No.: 15/735,662

(22) PCT Filed: Jun. 14, 2016

(86) PCT No.: PCT/US2016/037393
§ 371 (c)(1),
(2) Date: Dec. 12, 2017

(87) PCT Pub. No.: WO2016/209666
PCT Pub. Date: Dec. 29, 2016

(65) Prior Publication Data
US 2018/0315880 A1    Nov. 1, 2018

Related U.S. Application Data

(60) Provisional application No. 62/175,695, filed on Jun. 15, 2015.

(51) Int. Cl.
*H01L 31/09* (2006.01)
*H01G 9/20* (2006.01)
(Continued)

(52) U.S. Cl.
CPC ......... *H01L 31/09* (2013.01); *G01N 21/3581* (2013.01); *H01G 9/2045* (2013.01); *G01N 2021/258* (2013.01); *Y02E 10/542* (2013.01)

(58) Field of Classification Search
CPC ................................ H01L 31/09; G01N 31/09
See application file for complete search history.

(56) References Cited

U.S. PATENT DOCUMENTS 9,105,791 B1   8/2015  Dyer et al.
2014/0319357 A1* 10/2014  Ogawa .................. G01J 1/0429
                                                    250/349

FOREIGN PATENT DOCUMENTS

WO        2016140946  A1      9/2016

OTHER PUBLICATIONS

Kim et al., "Electrical Control of Optical Plasmon Resonance with Graphene", Nano Letters, 2012, 12 (11), pp. 5598-5602.
(Continued)

*Primary Examiner* — Edwin C Gunberg
(74) *Attorney, Agent, or Firm* — Rosenberg, Klein & Lee

(57) ABSTRACT

A new approach to graphene-enabled plasmonic resonant structures in the THz is demonstrated in a hybrid graphene-metal design in which the graphene acts as a gate-tunable inductor, and metal acts as a capacitive reservoir for charge accumulation. A large resonant absorption in graphene can be achieved using the metal-graphene plasmonic scheme,
(Continued)

and the peak can approach 100% in an optimized device, ideal for graphene-based THz detectors. Using high mobility graphene ($\mu$>50000 $cm^2V^{-1}s^{-1}$) will allow anomalously high resonant THz transmission (near 100%) through ultra-subwavelength graphene-filled metallic apertures at a resonance frequency that is gate tunable. This metal-graphene plasmonic scheme enables near perfect tunable THz filter or modulator.

20 Claims, 10 Drawing Sheets

(51) Int. Cl.
*G01N 21/3581* (2014.01)
*G01N 21/25* (2006.01)

(56) References Cited

OTHER PUBLICATIONS

Jadidi et al., "Tunable Terahertz Hybrid Metal-Graphene Plasmons", Nano Letters, 2015, 15 (10), pp. 7099-7104. **Cited in PCT and Published After Earliest Priority Date of Subject Application.

Miao et al., "Widely Tunable Terahertz Phase Modulation with Gate-Controlled Graphene Metasurfaces", Phys. Rev. X 5, 041027—Published Nov. 16, 2015. **Cited in PCT and Published After Earliest Priority Date of Subject Application.

Emani et al, "Electrically Tunable Damping of Plasmonic Resonances with Graphene", Nano Letters, 2012, 12 (10), pp. 5202-5206.

Valmorra et al, "Low-Bias Active Control of Terahertz Waves by Coupling Large-Area CVD Graphene to a Terahertz Metamaterial", Nano Lettters, 2013, 13 (7), pp. 3193-3198.

* cited by examiner

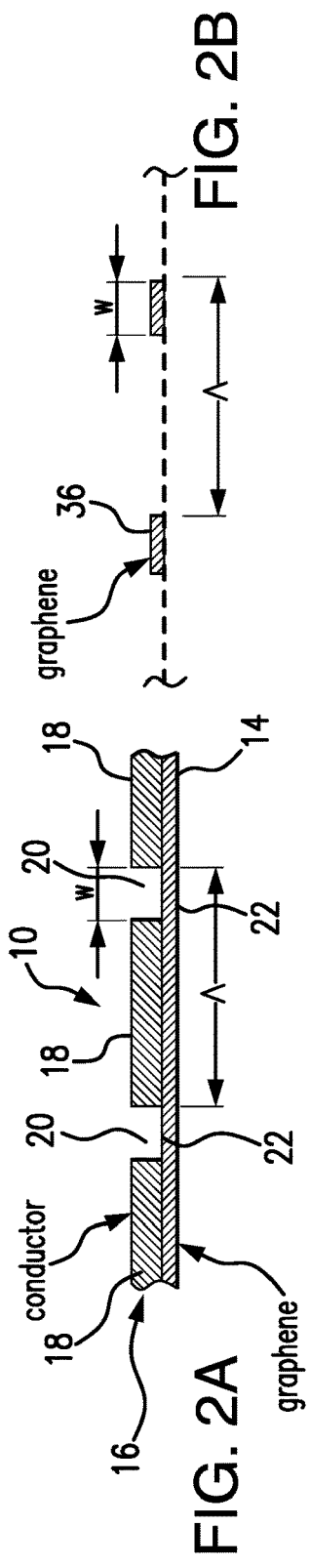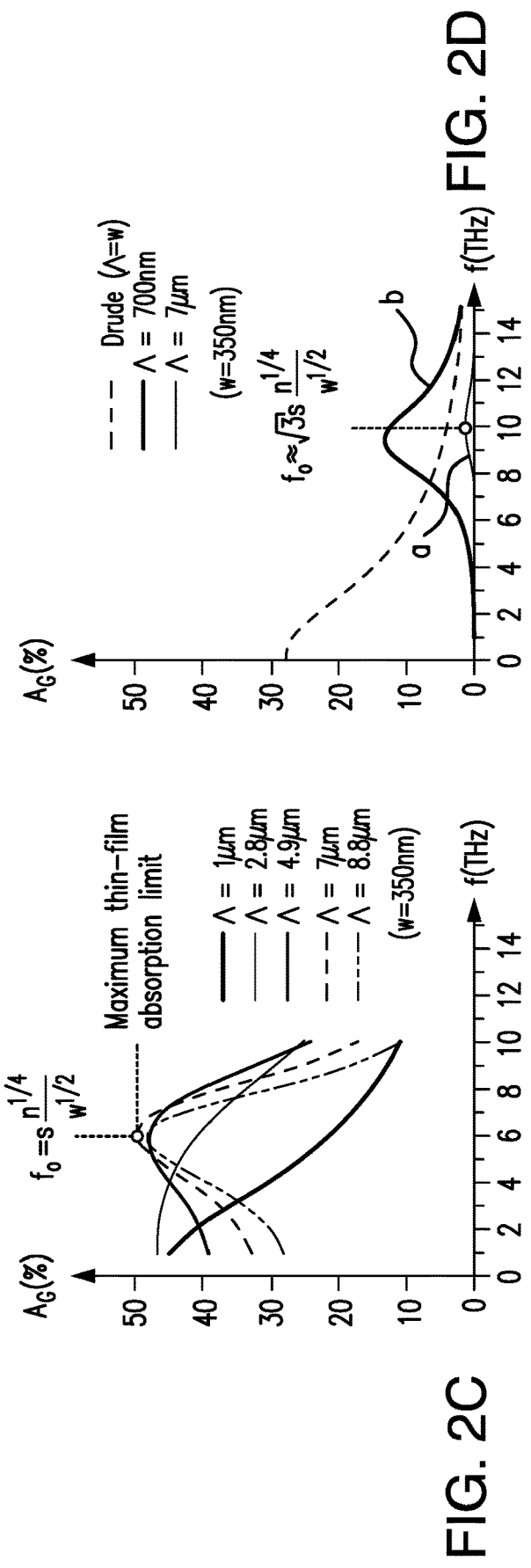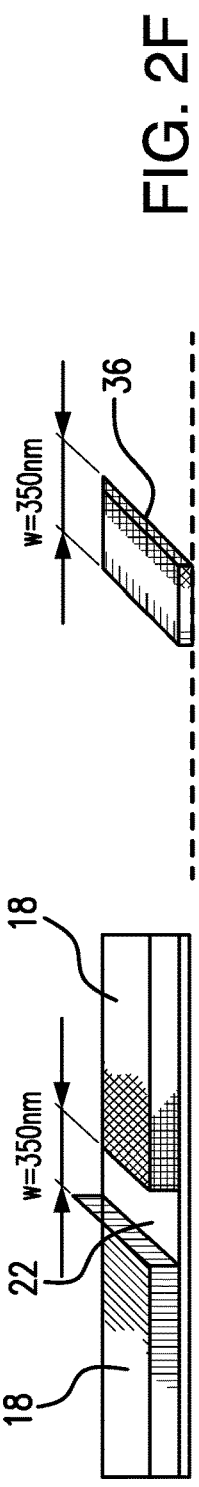
FIG. 2A  FIG. 2B  FIG. 2C  FIG. 2D  FIG. 2E  FIG. 2F

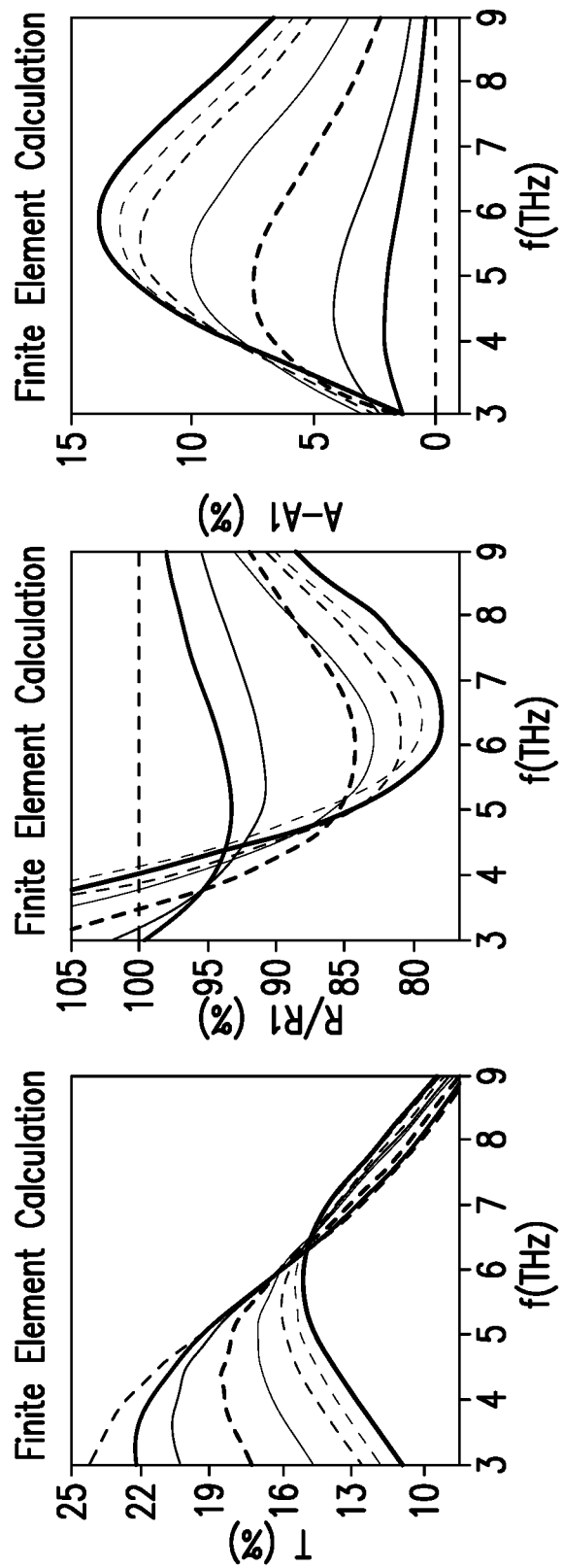

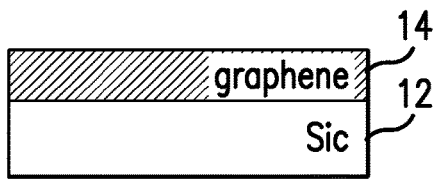
FIG. 9A
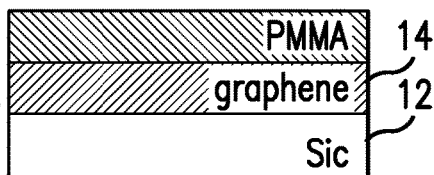
FIG. 9B
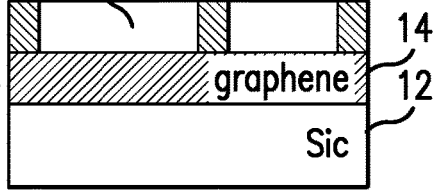
FIG. 9C
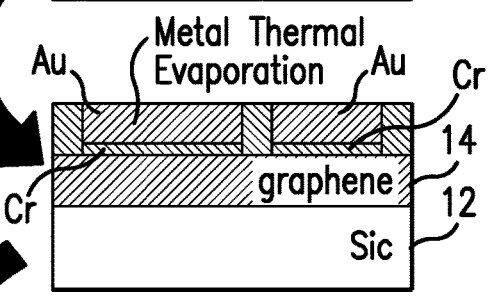
FIG. 9D
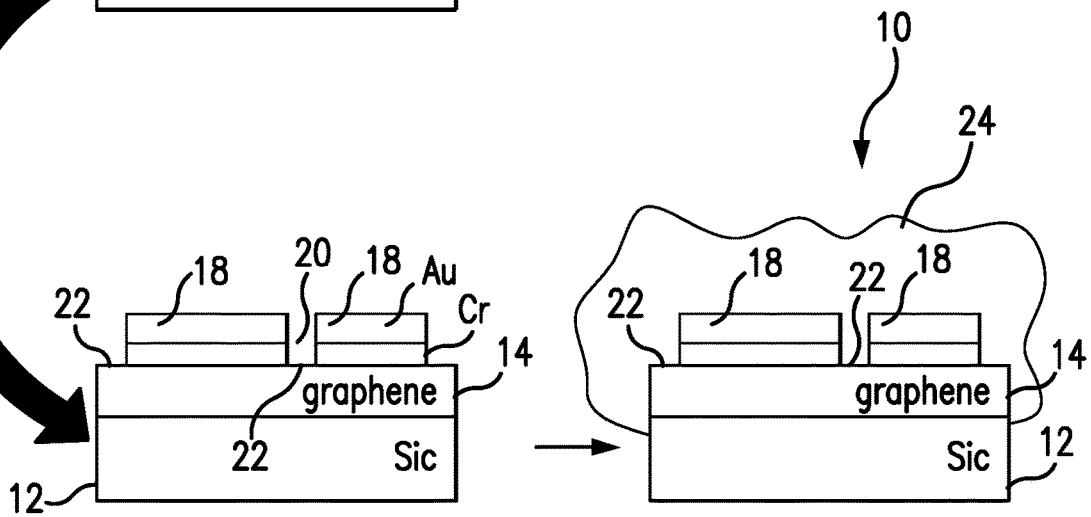
FIG. 9E
FIG. 9F

HYBRID METAL-GRAPHENE TERAHERTZ OPTOELECTRONIC SYSTEM WITH TUNABLE PLASMONIC RESONANCE AND METHOD OF FABRICATION

STATEMENT REGARDING FEDERAL SPONSORED RESEARCH OR DEVELOPMENT

This invention was made with government support under N000141310865 awarded by the Office of Naval Research (ONR). The government has certain rights in the invention.

REFERENCE TO THE RELATED APPLICATIONS

This Utility patent application is a National Stage Application of PCT/US16/37393 filed on 14 Jun. 2016 and is based on a Provisional Patent Application No. 62/175,695 filed on 15 Jun. 2015.

FIELD OF THE INVENTION

The present invention is directed to optoelectronics, and in particular, to graphene-based large area terahertz optoelectronic systems with an increased absorption efficiency and tunable operational parameters.

More in particular, the present invention is directed to optoelectronic devices with the performance enhanced by a unique type of plasmon resonance which occurs when graphene is connected to a metal and when a tunable plasmonic channel is incorporated into the device with electrical contacts, which is an important step in the fabrication of practical graphene-based terahertz optoelectronics.

In addition, the present invention is directed to large area terahertz optoelectronic systems (photodetectors, filters, modulators, and oscillators) with improved operational parameters attained through utilizing a tunable graphene-enabled plasmonic resonance in a hybrid graphene-metal design composed of a periodic array of narrow graphene channels formed in a metal (conductive) layer which is patterned on a continuous graphene layer. In these systems graphene acts as a gate-tunable inductor, while the metal acts as a capacitive reservoir for charge accumulation.

The present invention also is directed to hybrid metal-graphene based terahertz photodetectors exhibiting strong absorption and a fast response, which are tunable over a broad range of frequency in the THz (terahertz) spectrum by changing the dimensions of graphene micro-ribbons and/or the carrier density, which are amenable to fabrication of arrays for large-area photodetectors.

Furthermore, the present invention is directed to optoelectronic systems exhibiting anomalously high resonant absorption (or transmission) when sub-wavelength graphene-filled apertures are introduced into a conductive layer.

BACKGROUND OF THE INVENTION

Plasmonic resonances in finite-size two-dimensional conductors are able to couple strongly with THz radiation and can be tuned by application of a gate voltage, as presented in Ju Long, et al., "Graphene Plasmonics for Tunable Terahertz Metamaterials", Nature Nanotec., 6, 630-634 (2011), and Yan Hugen, et al., "Tunable Infrared Plasmonic Devices using Graphene/Insulator Stacks", Nature Nanotec., 7, 330-345 (2012). These features are attractive for a variety of electrically tunable terahertz devices, such as, for example, detectors, emitters, filters, and modulators.

Among various two-dimensional systems, graphene is a particularly attractive plasmonic medium due to its electrical and thermal properties at room temperature. Particularly promising is terahertz (THz) photodetection, in which graphene-based devices may offer significant advantages over existing technology in terms of speed and sensitivity.

Due to graphene's low electronic heat capacity and relatively large electron-electron relaxation rate compared to its electron-phonon relaxation rate, hot electron effects are prominent in graphene even at room temperatures. The hot electron effects have been exploited to attain fast and sensitive THz detection via the photothermoelectric effect and bolometric effect.

Observed plasmonic resonances occur in isolated graphene elements, where the isolating charge accumulates at opposite edges of a sub-wavelength graphene element. Integrating such a plasmonic element with an antenna, metamaterial, or electrical contact greatly increases the range of potential applications. However, a conductive boundary inhibits the accumulation of charge at the edges which was previously thought to prevent the plasmonic resonance.

In addition, a significant challenge remains in increasing graphene's absorption. Graphene's interband absorption is determined through a frequency-independent constant $\pi\alpha \approx 2.3\%$, where $\alpha$ is a fine structure constant. Owing to its zero band gap nature, doped graphene shows a relatively high DC activity, resulting in a considerable Drude absorption (free carrier response) in the THz range. However, the Drude absorption in graphene is strongly frequency dependent, decreasing by $(\omega\tau)^{-2}$ degrees at high frequency $\omega \gg 1/\tau$, where $\tau$ is a scattering time, proportional to graphene's mobility, and typically ranges between 10 fs and 100 fs in graphene. Thus, the Drude absorption rolls off at the lower frequencies in high mobility graphene samples.

Among its many outstanding properties, graphene supports terahertz two-dimensional plasma waves: subwavelength charge density oscillations connected with electromagnetic fields that are tightly localized near the graphene sheet. When these waves are confined to finite-sized graphene, plasmon resonances emerge that are characterized by alternating charge accumulation at the opposing edges of the graphene. The resonant frequency of such a structure depends on both the size and the surface charge density and can be electrostatically tuned throughout the terahertz range by applying a gate voltage.

Graphene plasmons have been explored or proposed for use in biosensors, terahertz detectors, terahertz emitters, and a growing number of devices in the nascent field of terahertz optoelectronics. It is increasingly recognized that graphene holds the potential for filling a critical gap in terahertz technology.

The promise of tunable graphene THz plasmonics has yet to be fulfilled, because most proposed optoelectronic devices require near total modulation of the absorption or transmission, and need antenna coupling or electrical contacts to the graphene. Such constraints are difficult to meet using existing plasmonic structures. Until now, there was no experimental evidence that two-dimensional plasmons could be confined with conductive boundaries.

A number of efforts have been made to increase the absorption in graphene photodetectors. For example, quantum dots have been deposited on graphene to enhance the light-scattering direction. However, this approach is limited to the visible or near infrared (where the interband absorption of the quantum dot lies), and the response times are unacceptably slow.

Another approach contemplates placing a photodetector in a micro cavity, which resonates at a selected frequency. This approach can enhance absorption, but to date this has been demonstrated only at near-infrared wavelengths and can be cumbersome for long wavelength THz radiation.

Coupling the detector to an antenna is a viable approach for frequencies up to the low THz, but there are few demonstrations of antenna-coupled graphene devices, and the approach is applicable only to devices whose size is much smaller than the wavelength.

It is therefore desirable to overcome the deficiency of the prior approaches in pursuit to achieve a strong absorption and attain improved operational parameters in graphene-based optoelectronic systems.

SUMMARY OF THE INVENTION

It is an object of the present invention to provide a new class of plasmon resonances that occur when graphene fills a metallic aperture and a graphene-enabled plasmonic resonant structure operating in the THz based on new plasmon resonance modes which exploit a unique gate-tunable inductance of graphene to produce a resonance in a metallic structure.

It is another object of the present invention to provide an optoelectronic system, where terahertz plasmonic resonances are supported in the metal-contacted graphene where the graphene acts as a gate-tunable inductor, and the metal acts as a capacitive reservoir for charge accumulation. When the mobility μ exceeds 50,000 cm$^2$/V·s, uniquely high resonant transmission is attained in a high-mobility graphene which reaches nearly 100% resonant THz transmission beneficial for near perfect tunable THz filters or modulators.

In addition, an object of the present invention is to provide a hybrid metal graphene based optoelectronic device where a large resonant absorption is attained in a low-mobility graphene (μ≈1000 cm$^2$/V·s), with a peak of resonant absorption approaching 100% which is ideal for graphene-based THz detectors.

It is still a further object of the present invention to provide a hybrid metal-graphene based terahertz optoelectronic system where a periodic array of narrow graphene channels is formed in a conductive (metallic) layer patterned on top of a continuous graphene layer, and where terahertz plasmonic resonances result from strong coupling of the plasmonic mode to an incident terahertz radiation so that an extremely strong absorption in graphene is achieved at a gate-tunable resonance frequency.

It is also an object of the present invention to provide a graphene-based terahertz photodetector with increased absorption efficiency, high responsivity, and tunability of operational parameters over a broad range of frequencies in THz spectrum which is suitable for fabrication of arrays of large-area optoelectronic devices.

In one aspect, the present invention is related to a hybrid metal-graphene based terahertz optoelectronic system with tunable plasmonic resonance which comprises a first periodic array of conductive stripes formed above a substrate, and a layer of graphene sandwiched between the substrate and the first periodic array of the conductive stripes. The layer of graphene comprises a second periodic array of graphene channels confined in the respective gaps between the neighboring conductive stripes. The width of each of the conductive stripes exceeds a width of each of the graphene channels.

The subject plasmon-enhanced terahertz graphene-based optoelectronic structure further includes an electrolyte layer positioned atop and enveloping the first periodic array of conductive stripes and the second periodic array of the graphene channels.

The plasmon-enhanced terahertz graphene-based optoelectronic structure further includes a source terminal and a drain terminal coupled to respective conductive stripes of the first periodic array, and a gate terminal coupled between the electrolyte layer and the layer of graphene. A source of gate voltage $V_g$ is applied between the source and gate terminals to tune operational parameters of the optoelectronic structure.

The subject plasmon-enhanced graphene-based optoelectronic structure further includes a source of a linearly polarized light which is directed incident on the graphene channels. The light is polarized substantially perpendicular to the graphene channels.

In operation, the polarized light excites transverse plasmon in the graphene channels. The plasmon resonance frequency and strength of the resonance absorption is controlled through controlling the gate voltage $V_g$ to tune carriers density in the graphene layer.

In addition, the plasmon resonance frequency and strength of the resonance absorption is controlled through adjusting the geometrical features of the structure, such as the width of the conductive stripes, and/or the width of the graphene channels.

The width of each graphene channel falls in a sub-micron range, and may range from 100 nm to few microns depending on the desired plasmon resonance frequency.

In the plasmon-enhanced terahertz graphene-based optoelectronic structure, a ratio Λ/w between a period Λ of the first array of conductive stripes and the width w of each graphene channel exceeds 10, and may be greater than 20.

In some embodiments, the period Λ of the array of conductive stripes ranges from 1 μm to 9 μm.

Alternatively, the plasmon resonance frequency and strength of the resonance absorption is controlled in the subject optoelectronic system by controlling gate voltage $V_g$ to tune carrier density in the graphene layer.

As an example, the ratio Λ/w of the period Λ of the first array of conductive stripes to the width w of each graphene channel is chosen to be approximately 20:1 when the mobility of carriers in the graphene layer is 1,000 cm$^2$/V·s to achieve the maximal absorption in graphene for carrier density of 1.5×10$^{13}$ cm$^{-2}$. For other graphene qualities (mobility), the optimal Λ/w for achieving the maximal absorption can be calculated using tan equivalent circuit model.

The subject plasmon-enhanced terahertz graphene-based optoelectronic structure acts as a tunable photodetector with a uniquely high absorption (approximating 100%) when the mobility of carriers in the graphene layer is as low as approximately 1000 cm$^2$/V·s.

The subject plasmon-enhanced terahertz graphene-based optoelectronic structure acts as a tunable filter or modulator when the graphene mobility is high (over 50,000 cm$^2$/V·s) and is tuned through application of the controllable $V_g$.

In another aspect, the present invention is directed to a method of fabrication of a plasmon-enhanced terahertz hybrid metal graphene-based optoelectronic system, which is accomplished through the sequence of the following steps:

epitaxially forming a single layer of graphene on a SiC substrate, and forming a periodic array of metallic (for example, gold) stripes in electrical contact with the graphene layer. Plasmonic graphene channels are defined between adjacent metallic stripes.

The subject method continues with the steps of:
forming a gate terminal,
applying a layer of electrolyte atop of the periodic array of metallic stripes to envelope and being in contact with an array of graphene channels and the array of metallic stripes, and
coupling the gate terminal to the electrolyte layer.

A source of gate voltage is coupled between the graphene and the gate terminal.

In order to achieve a plasmon resonance with a quality factor larger than 1 in graphene with the mobility of few thousands $cm^2/V \cdot s$, a ratio of a period $\Lambda$ of the periodic array of the metallic stripes to a width w of each graphene channel exceeds 10.

Upon exposing the optoelectronic structure to an incident electromagnetic wave polarized in a direction perpendicular to the graphene channels, a transverse plasmon resonance is excited in the structure which is controlled by varying gate voltage to tune the carrier density of the graphene layer.

A new type of the plasmon resonance which occurs when graphene is connected to a metal underlies the operation of the subject optoelectronic system. These new plasmon modes offer the potential to incorporate a tunable plasmonic channel into a device with electrical contacts, which is an important step toward practical graphene terahertz optoelectronics. Through theory and experiments, an anomalously high resonant absorption (or transmission) has been demonstrated when subwavelength graphene-filled apertures are introduced into an otherwise conductive layer. These tunable plasmon resonances are essential yet missing ingredients needed for terahertz filters, oscillators, detectors, and modulators.

These and other objects of the present invention will become apparent when considered in view of further descriptions accompanying the patent drawings.

BRIEF DESCRIPTION OF THE DRAWINGS

FIG. 2A is a schematic representation of the subject metal on graphene grating;

FIG. 2B is a schematic representation of the array of isolated (no metal contact) graphene ribbons;

FIG. 2C is a diagram representative of the graphene absorption ($A_G$) under electromagnetic wave excitation-of-metal on graphene gratings with different periods ($\Lambda$) as a function of the frequency f for structure shown in FIG. 2A;

FIG. 2D is a diagram representative of the graphene absorption ($A_G$) of an array of isolated graphene ribbons shown in FIG. 2B with the same graphene parameters as in the structure shown in FIG. 2A;

FIGS. 2E and 2F are representative of charge density profiles at the plasmon frequency for metal-graphene structure of FIG. 2A and the graphene ribbons of FIG. 2B, respectively;

FIG. 4D is a diagraph representative of the finite element calculations of Transmission for different carrier densities;

FIG. 4E is a diagram representative of the finite element calculations of the normalized reflection for different carrier densities;

FIG. 4F is a diagram representative of the finite element calculations of the parameter A=1−R−T for different carrier densities;

FIGS. 9A-9F are representative of the sequence of manufacturing steps for fabrication of the subject metal-graphene based optoelectronic structure.

DETAILED DESCRIPTION OF THE PREFERRED EMBODIMENTS

A new type of plasmon resonance that occurs when graphene is connected to a metal has been discovered. The new plasmon modes offer the potential to incorporate a tunable plasmonic channel into a device with electrical contacts, which is an important step toward fabrication of practical graphene terahertz optoelectronics. Anomalously high resonant absorption (or transmission) has been demonstrated when subwavelength graphene-filled apertures are introduced into an otherwise conductive layer. These tunable plasmon resonances are important ingredients needed for terahertz filters, oscillators, detectors, and modulators.

Analytic calculations, numerical simulations, and THz reflection and transmission measurements have been performed (as described in further paragraphs) to confirm the principle of operation of the subject optoelectronic system. These plasmon modes exploit the unique gate-tunable inductance of graphene to produce a resonance in a metallic structure that, by itself, exhibits no resonance. Unlike graphene ribbons (with no metal contact) which absorb only a few percent of incident radiation at the resonant frequency, the new plasmon modes in the subject optoelectronic structure couple strongly to incident terahertz radiation and can achieve maximal absorption in monolayer graphene apertures at a resonance frequency that is gate-tunable.

Additionally, an equivalent circuit model that predicts the resonant frequency, line width, and impedance matching condition of the fundamental plasmon mode has been introduced which can be used for designing graphene plasmonic metamaterials and antenna coupled devices.

High mobility graphene (such as, for example, 50,000 cm$^2$/V·s) is envisioned to produce a tunable resonance peak in transmission that approaches 100%, which is ideal for THz modulators and tunable bandpass filters.

Figures 1A, 1B:
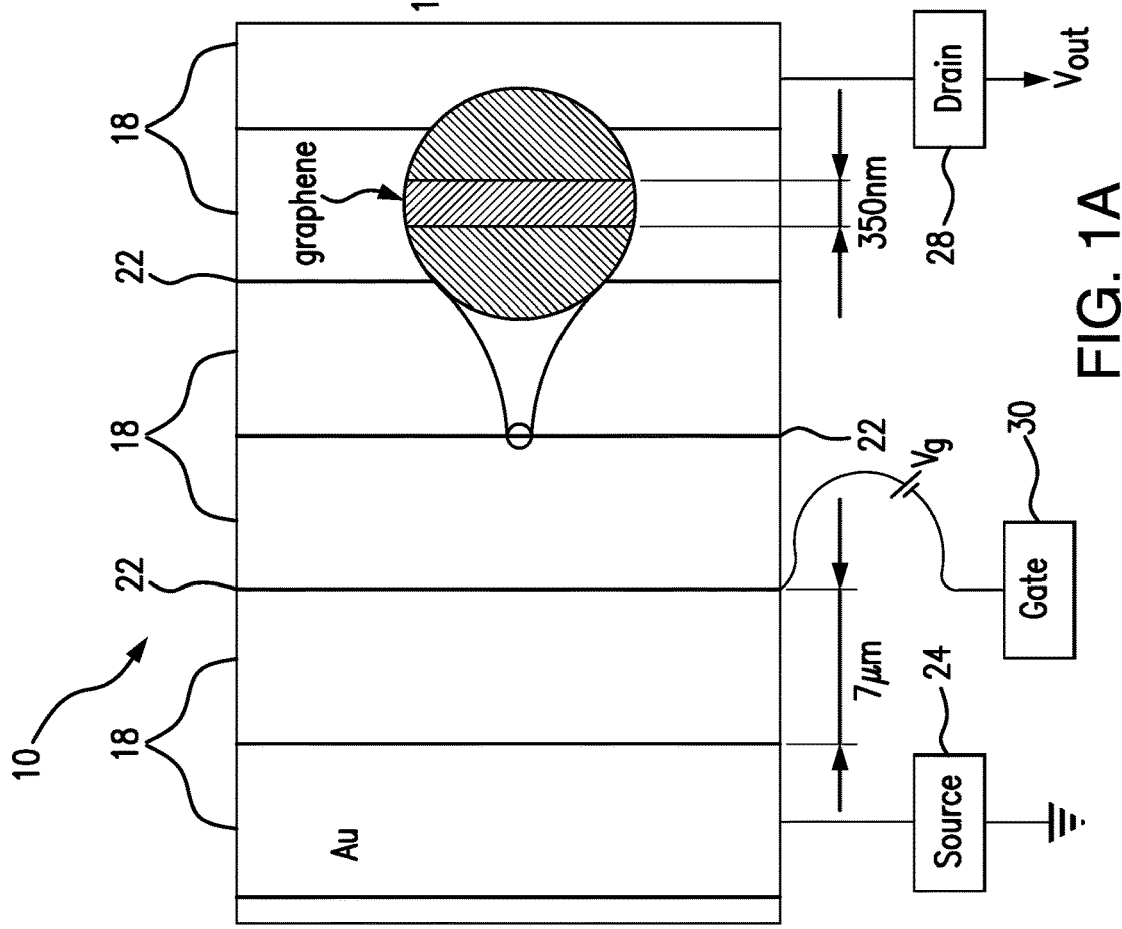
FIG. 1A is an SEM (Scanning Electron Microscope) image of a small part of the topology of a subject hybrid metal-graphene based optoelectronic system.
FIG. 1B is a side view of the subject hybrid metal-graphene based optoelectronic system showing the applied controllable gate voltage $V_g$ and an incident electromagnetic wave polarized perpendicular to the graphene channels, as well as the Reflected (R) and Transmitted (T) portions of the radiation.

Referring to FIGS. 1A-1B and 2A, the metal-graphene based plasmon-enhanced terahertz (THz) optoelectronic structure 10 is formed on a substrate 12, for example, an SiC substrate. The subject optoelectronic structure 10 includes a continuous graphene layer 14 and a conductive (metallic) layer 16 formed (deposited) on the graphene layer 14 and patterned to form a periodic array of stripes (or strips) 18 of the conductive (for example, Au) material separated by narrow slots (gaps) 20 between the metal stripes 18 with exposed graphene layer portions 22, further referred to herein as graphene channels or graphene lines.

As shown in FIGS. 1A-1B and 2A, the subject optoelectronic structure 10 constitutes a periodic array of sub-micron graphene lines (also referred to herein as graphene channels) 22 defined between conductive stripes 18.

Geometrical parameters of the periodic arrays of the conductive stripes and the graphene channels are important for the operation of the subject structure, as will be detailed in further paragraphs, and are controlled to tune the plasmon resonance modes in the subject structure.

It has been demonstrated that the period Λ of the periodic array of conductive stripes 18 must exceed the width w of the graphene channels, i.e., Λ>>w. The ratio of Λ/w may exceed 10, and may be as high as 20, or higher.

For example, the width of the metal stripes 18 ranges in μm diapason, and in one of the examples, may approximate 7 μm. The width w of the graphene lines 22 falls in a sub-micron range, and, in exemplary embodiments, can be between approximately 100 nm and few micrometers.

A layer of an electrolyte 24 is formed on the top of the metal grating. In one of the embodiments, when the optoelectronic structure 10 is formed as a photodetector, the outermost metal stripes form the source terminal 26 and a drain terminal 28.

A gate terminal 30 is coupled to the graphene layer 14 via the electrolyte layer 24, as shown in FIG. 1B. A gate voltage $V_g$ is applied between the graphene layer 14 and the gate terminal 30.

For a potential detector application, when an electromagnetic wave (light) 32 at frequency ω, preferably in the terahertz spectrum, is incident on the optoelectronic structure 10, electrons in graphene channels 22 are heated by the incident light 32, and the metal contacts (conductive stripes 18) serve as a heat sink, resulting in a non-uniform electron temperature T(s) as a function of position x within the device. Diffusion of hot electrons through the graphene sub-micron channels 22 creates a potential gradient.

The total output signal Vout is the integral of the potential gradient over the device length. In addition, the graphene acts as a gate-tunable inductor in the structure 10 variable by the application of the controllable gate voltage $V_g$, and the metal stripes 18 act as a capacitive reservoir for charge accumulation.

Terahertz plasmonic resonances have been experimentally demonstrated in the metal-contacted graphene, and a numerical verification of this phenomenon and a theoretical description of the physics of the unique oscillating modes occurring in the subject optoelectronic structure 10 will be detailed in the following paragraphs.

The plasmon mode in the optoelectronic structure 10 shows strong coupling to the incident terahertz radiation 32, so that an extremely strong absorption in graphene layer 14 can be achieved at a resonance frequency which is gate-tunable. Simultaneous measurements of Transmission and Reflection have been carried out to experimentally observe this resonant absorption effect.

FIG. 2A shows the structure of the subject metal-contacted graphene plasmonic device 10 which is composed of a periodic array of narrow slots 20 formed in the conductive (metallic) layer 16 that is patterned on top of the continuous graphene layer 14. For comparison, an array of isolated graphene ribbons 36 of comparable dimension is shown in FIG. 2B. In both cases, the period Λ of the periodic array is assumed to be small compared to the free-space wavelength. To calculate the plasmon resonances and absorption in the structures, shown in FIGS. 2A-2B, the method described in S. A. Mikhailov, et al., "Influence of contacts on the microwave response of a two-dimensional electron stripe", Phys. Rev., B 74, 045325 (2006) has been adapted to obtain an integral equation for the in-plane electric field when the optoelectronic structure 10 is illuminated by a normally incident plane wave 32 at a frequency ω that is linearly polarized in the direction perpendicular to the graphene channels 20.

Plasmon Modes in Metal/Graphene Grating

Figure 6:
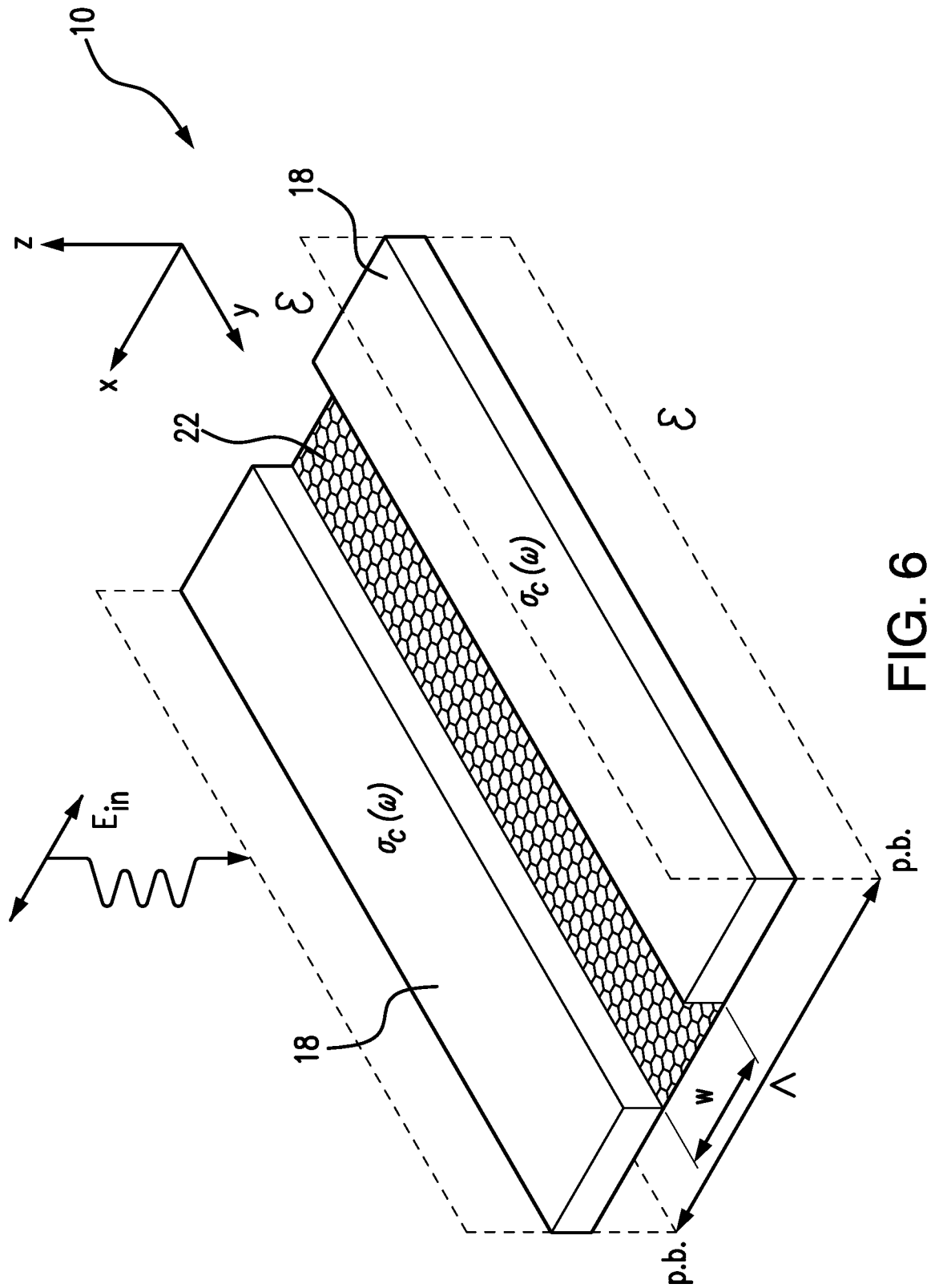
FIG. 6 is a schematic diagram of a unit cell of the subject periodic structure.

Maxwell's equations have been solved for the general case of plasmon modes in a graphene-metal array with period Λ under normal-incidence plane-wave excitation as shown in FIG. 6 where a unit cell 10 of a periodic array (in x direction) of graphene-contact is presented. In FIG. 6, the parameter Λ is the array period of the periodic array of the metallic stripes 18, and w is the width of the graphene channel 22, E is the dielectric constant of the surrounding material, $\sigma_c(\omega)$ is the metal contact conductivity, and p.b. stands for periodic boundary.

The method described in S. A. Mikhailov, et al., "Influence of contacts on the microwave response of a two-dimensional electron stripe", Phys. Rev., B 74, 045325 (2006), has been employed to obtain an integral equation for the E(x), complex amplitude of the x-polarized electric field within the graphene channel, $$E(x) = \frac{\beta_C}{\beta\left(1 + \frac{\beta_C}{2}\right)} E_{in} + \frac{\beta - \beta_C}{\beta\Lambda} \sum_{l=-\infty}^{\infty} \frac{e^{i2\pi lx/\Lambda}}{1 + i\frac{\kappa_l \beta_C}{2}} \int_{-w/2}^{w/2} E(x')e^{i2\pi lx'/\Lambda} dx' \quad \text{(Eq. 1)}$$

where $E_{in}$ denotes the complex amplitude of the normally-incident x-polarized incident plane wave with free-space wavelength λ, and $\kappa_l^2 = [l\lambda/\Lambda^2 - 1]$.

β and $β_c$ represent the frequency-dependent (Drude) conductivity of the 2D material and contact, respectively, normalized to the free-space impedance, $$\beta = \sigma(\omega)\sqrt{\frac{\mu_0}{\epsilon}}, \beta_C = \sigma_C(\omega)\sqrt{\frac{\mu_0}{\epsilon}} \quad \text{(Eq. 2)}$$

The contact conductivity $\sigma_c$ is either zero, to model isolated graphene ribbons without contacts, or infinity to model a perfect electrical conducting boundary, or more generally it can describe the Drude response of an arbitrary conductive contact.

By Fourier-expanding the electric field in the graphene channel from $-w/2$ to $+w/2$, $$E(x) = \sum_{n=0}^{\infty} E_n \cos(2\pi nx/w) \quad \text{(Eq. 3)}$$

The integral equation (Eq. 1) can be re-cast as a matrix equation, $$\left[\frac{1+\delta_{0m}}{2}\delta_{mn} + \frac{(\beta_c - \beta)}{4\beta}\frac{W}{\Lambda}\sum_{n=0}^{\infty}\frac{R_{mn}^{(l)}}{1+i\frac{\kappa_l \beta_C}{2}}\right]E_n = \quad \text{(Eq. 4)}$$

$$\delta_{m0}\frac{\beta_C}{\beta(1+\beta_C/2)}E_{in}$$

where $$R_{mn}^{(l)} \equiv [\text{sinc}(n\pi+l\pi w/\Lambda)+\text{sinc}(n\pi-l\pi w/\Lambda)] \times [\text{sinc}(m\pi+l\pi w/\Lambda)+\text{sinc}(m\pi-l\pi w/\Lambda)] \quad \text{(Eq. 5)}$$

The Fourier components of the electric field can be obtained by numerically solving Eq. 4. In practice, for smoothly-varying plasmon modes, only the lowest few Fourier components are needed to accurately approximate the field.

Then, from E(x), the fractional absorbed power in the 2D material is computed as $$A_G(\omega) = \frac{Z_0/\sqrt{\epsilon_0}}{2\Lambda |E_{in}|^2}\int_{-w/2}^{w/2}\text{Re}\{J^*(x)E(x)dx\} = \quad \text{(Eq. 6)}$$

$$\frac{\text{Re}\{\beta\}}{2\Lambda}\frac{1}{|E_{in}|^2}\int_{-w/2}^{w/2}|E(x)|^2\, dx$$

The resonant modes and fractional absorption A (ω) in the graphene channel are subsequently found by integrating the Joule power density over the graphene ribbon, and normalizing to the incident power of the plane wave (Eq. 6). The absorption spectrum reveals all of the dipole-active plasmon resonances and the relative coupling of these modes to radiation.

FIG. 2C represents the theoretically computed absorption spectrum A(ω) for several different metal periods Λ, with the graphene channel 22 width w (w=350 nm) remaining constant. The mobility μ and density n of carriers (electrons or holes) are n=1.5×10$^{13}$ cm$^{-2}$, μ=1000 cm$^2$/V·s, respectively. The array shows no discernable plasmon resonance when the period Λ and the graphene channel width w are comparable, manifesting instead a Drude-like response. However, when the metal contacts (stripes) 18 are made much wider than the graphene channels 22, a strong resonance emerges, characterized by high absorption in the graphene channels, at a resonant frequency that scales with $n^{1/4}w^{-1/2}$, similar to the plasmon resonances in uncontacted graphene ribbons. (L. Ju, et al., "Graphene plasmonics for tunable terahertz metamaterials", Nature Nanotech. 6, 630-634 (2011); and P. Nene, et al., "Coupling of plasmon modes in graphene microstructures", Appl. Phys. Lett., 105, 143108 (2014)).

The surrounding material is assumed to be a uniform dielectric, in which case, the maximum achievable absorption in a two-dimensional (metal-graphene grating) is 50% (C. Hilsum, "Infrared Absorption of Thin Metal Films", J. Opt. Soc. Am 44, 187-191 (1954)).

As shown in FIG. 2C, at the resonant frequency, the graphene absorption reaches a peak of the maximum possible value (50%), even when the geometrical fill factor is only w/Λ=1/20 (5%). This suggests (at plasmon frequency) an extremely high confinement of the THz field in the narrow slots 20 where graphene is located. This makes the metal-graphene scheme an attractive candidate for nonlinear THz plasmonic applications. It was noted that by using known techniques, such as an antireflection coating or a Salisbury screen on top of the grating, the thin film limit absorption can be increased to nearly 100%, and a perfect tunable graphene plasmonic absorber can be achieved.

The calculations confirm that the resonances disappear when the graphene is absent, when the polarization is rotated parallel to the channels, or when the graphene is electrostatically gated to the charge neutral point.

For comparison, in FIG. 2D, an absorption spectrum is shown for the array (FIG. 2B) of electrically isolated graphene channels having the width, carrier density, and mobility identical to that shown in FIG. 2A, which yields a far lower on-resonant absorption (curve a), even when the fill-factor is increased to 50% (curve b).

The nature of the fundamental metal-graphene plasmon resonance is illustrated in FIG. 2E, which shows the charge density calculated at the resonant frequency. For comparison, FIG. 2F shows the charge density profile at plasmon resonance for the uncontacted graphene ribbon (FIG. 2B) of the same dimension.

In the contacted graphene (FIG. 2A), the metal regions act as capacitive reservoir for charge accumulation, and the graphene serves as an inductive channel, thus forming a resonant circuit that interacts strongly with the incident radiation. This phenomena is in contrast to the isolated ribbon case (of FIG. 2B), where the coupling to incident radiation is weaker, and does not depend sensitively on the grating period.

The extension of the spatial mode is accompanied by a significant reduction of plasmon frequency (by about a factor of $\approx\sqrt{3}$) in comparison with the plasmon frequency in an isolated graphene ribbon.

The factor $\sqrt{3}$ is an approximate ratio that is consistent with the postulate that a plasma wave incurs an approximate phase shift of approximately π/4 upon reflection from an open boundary, and 3π/4 upon reflection from a conductive boundary.

Figure 3A:
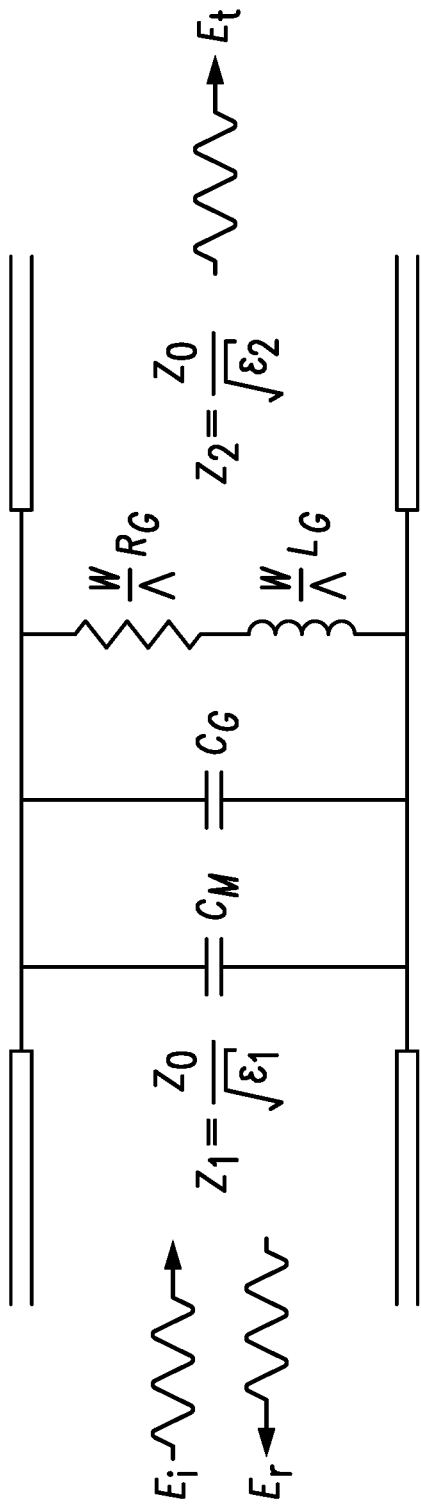
FIG. 3A is a schematic representation of the 4-terminal circuit model for the subject hybrid metal on graphene structure.

The optical properties of the subject metal-graphene plasmonic grating in the subwavelength limit, when Λ<λ (free space wavelength), can be modeled by an equivalent two-port circuit at the junction of two semi-infinite transmission lines with impedances $Z_0/\sqrt{\epsilon_1}$ and $Z_0/\sqrt{\epsilon_2}$, that represent the upper and lower regions respectively, as shown in FIG. 3A, where $Z_0$=377Ω, free space impedance.

The graphene behavior can be described by a Drude conductivity (DC)

$$\frac{1}{\sigma(\omega)} = \frac{1 - i\omega/\Gamma}{\sigma_0} = R_G - i\omega L_G \quad \text{(Eq. 7)}$$

where $\sigma_0 \equiv ne\mu$ represents the DC sheet conductivity of the graphene layer with carrier concentration n and mobility $\mu$, and $\Gamma \equiv ev_F\sqrt{\pi n}\mu/\hbar$ is the scattering rate.

From (Eq. 7), the graphene may be modeled by its ohmic resistance $R_G = \sigma_0^{-1}$ in series with its kinetic inductance, $L_G = (\sigma_0 \Gamma)^{-1}$ (Yao Yu, et al., "Broad Electrical Tuning of Graphene-Loaded Plasmonic Antennas", Nano Lett. 13, 1257-1264 (2013)).

$R_G$ and $L_G$ must each be multiplied by a geometrical factor of $w/\Lambda$ to account for the filling factor in the subject periodic structure. The conducting contacts (stripes) 18 act as a capacitive grid (U. Reinhard, "Far-infrared properties of metallic mesh and its complementary structure", Infrared Phys. 7, 27-55 (1967); and B. Lewis, et al., "Equivalent-circuit formulas for metal grid reflectors at a dielectric boundary", Appl. Optics, 24, 217-220 (1985)) that can be described by a capacitance $C_M = 2\epsilon_0\bar{\epsilon}\Lambda \ln[\csc(\pi w/2\Lambda)]/\pi$, where $\bar{\epsilon} = (\epsilon_1 + \epsilon_2)/2$ is the average dielectric permittivity.

The finite size graphene channels 22 contribute to an additional parallel capacitance, of $C_G = 2\epsilon_0\bar{\epsilon}\Lambda \ln[\sec(\pi w/2\Lambda)]/\pi$ (Alu Andrea, et al., "Input Impedance, Nanocircuit Loading, and Radiation Tuning of Optical Nanoantennas", Phys. Rev. Lett. 101, 043901 (2008)) to result in a total capacitance of $C = C_M + C_G = 2\epsilon_0\bar{\epsilon}\Lambda \ln[2 \csc(\pi w/\Lambda)]/\pi$.

Equivalent Circuit Model

Figure 3B:
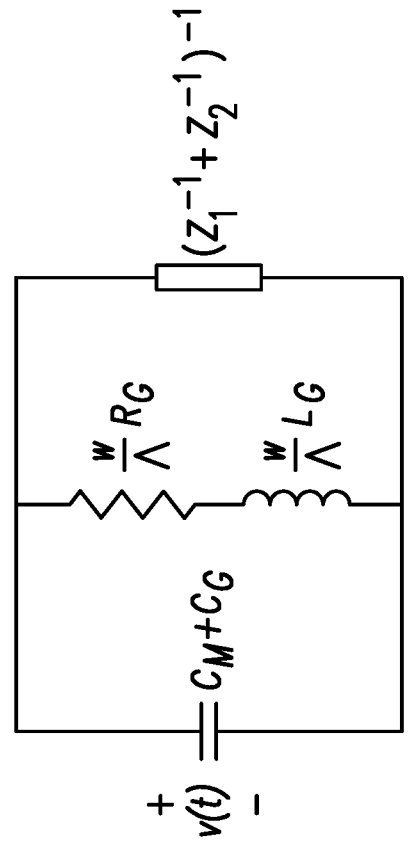
FIG. 3B is a simplified circuit model (no input waves) which is used to determine resonant (plasmon) frequency and the damping rate.

The optical response and plasmon resonance of the metal-graphene grating can be approximated from a two-port transmission line model shown in FIGS. 3A-3B, where FIG. 3A is an equivalent two-port transmission line model representing the sub-wavelength graphene-metal periodic structure, and FIG. 3B is a simplified circuit model where there are no input waves to the system, which is used to determine resonant (plasmon) frequency and damping rate. The resistance, inductance and capacitances appearing in this model are defined as:

$$R_G = \sigma_0^{-1} \quad \text{(Eq. 8)}$$

$$L_G = (\sigma_0 \Gamma)^{-1} \quad \text{(Eq. 9)}$$

$$C_G = 2\bar{\epsilon}\Lambda \ln[\sec(\pi w/2\Lambda)]/\pi \quad \text{(Eq. 10)}$$

$$C_M = 2\bar{\epsilon}\Lambda \ln[\csc(\pi w/2\Lambda)]/\pi \quad \text{(Eq. 11)}$$

and the incident and substrate regions are modeled as transmission lines with characteristic impedances of $Z_1 \equiv \sqrt{\mu_1/\epsilon_1}$ and $Z_2 \equiv \sqrt{\mu_2/\epsilon_2}$, respectively.

The graphene and contact capacitances can be combined into a single equivalent capacitance of $$c = C_M + C_G = 2\bar{\epsilon}\Lambda \ln[2 \csc(\pi w/2\Lambda)]/\pi \quad \text{(Eq. 12)}$$

As shown in FIG. 3A, this circuit models the transmission, reflection, and absorption for the lowest order plasmon mode in the plasmon device. The plasmon resonance frequency of this circuit is found to be $$\omega_0^2 = \frac{e^2 v_F \sqrt{\pi}}{2\hbar} \frac{\sqrt{n}}{w\epsilon_0\bar{\epsilon} \ln[2 \csc(\pi w/\Lambda)]} \quad \text{(Eq. 13)}$$

It has been noted that for a fixed duty cycle $w/\Lambda$, the resonant frequency in the subject structure scales in proportion to $n^{1/4}w^{-1/2}$, as for the case of uncontacted graphene ribbons (FIG. 2B). This indicates that the plasmon frequency $\omega_0$ can be tuned through the application of a gate voltage $V_g$ or by adjusting the graphene channel width.

The resonant frequency blue-shifts weakly with increasing duty cycle $w/\Lambda$, but in all of the cases, the resonance frequency is lower than that of an uncontacted graphene ribbon of the same width. Eq. 13 shows that increasing the period $\Lambda$ for a fixed width w will result in a slight red-shift of the plasmon frequency. This is in direct contrast to the case of uncontacted graphene ribbons, where the plasmon frequency is blue-shifted by increasing the period, as a result of the reduced dipolar plasmon mode coupling in adjacent graphene ribbons (P. Nene, et al., "Coupling of plasmon modes in graphene microstructures", Appl. Phys. Lett., 105, 143108 (2014)).

The plasmon line width, computed from the equivalent circuit model has been found to be $$\Delta\omega = \Gamma + \frac{\pi(Z_1^{-1} + Z_2^{-1})}{2\epsilon_0\bar{\epsilon}\Lambda \ln[2 \csc(\pi w/\Lambda)]} \quad \text{(Eq. 14)}$$

The first term in Eq. 14 is the conventional Drude line width, which is constrained by the mobility and carrier density, while the second term in Eq. 14 describes the radiative linewidth of the plasmon, which does not depend on the graphene quality or material properties. This second term, which is negligible for uncontacted graphene ribbons (of FIG. 2B) fundamentally limits the quality factor ($Q = \omega_0/\Delta\omega$).

$$Q = \frac{\omega_0}{\Delta\omega} \leq 2e\sqrt{v_F\sqrt{\pi}/2\hbar} \quad \text{(Eq. 15)}$$

$$\left(\sqrt{\frac{\epsilon_1}{\mu_0}} + \sqrt{\frac{\epsilon_2}{\mu_0}}\right)^{-1} \Lambda \sqrt{\frac{\bar{\epsilon}\sqrt{n} \ln[2 \csc(\pi w/\Lambda)]}{\pi^2 w}}$$

This suggests that increasing $\Lambda$ improves the quality factor of plasmon resonance. For the parameters considered in FIG. 2A, this equation predicts that for $\Lambda > 10w$, and particularly, $\Lambda > 11.5w$, a plasmon resonance with $Q > 1$ can be achieved.

The equivalent circuit model can also be used to predict the condition under which maximum power is delivered to the graphene layer.

Transmission, Reflection and Absorption

The relationship between the amplitudes of the incoming and outgoing wave amplitudes can be described by a scattering matrix, $$\begin{bmatrix} E_1^{(-)} \\ E_2^{(+)} \end{bmatrix} = \begin{bmatrix} S_{11} & S_{12} \\ S_{21} & S_{22} \end{bmatrix} \begin{bmatrix} E_1^{(+)} \\ E_2^{(-)} \end{bmatrix} \quad \text{(Eq. 16)}$$

For the circuit model shown in FIG. 3A, the scattering matrix is calculated to be:

$$\begin{bmatrix} S_{11} & S_{12} \\ S_{21} & S_{22} \end{bmatrix} = \frac{1}{Y_1 + Y_2 + Y(\omega)} \begin{bmatrix} Y_1 - Y_2 - Y(\omega) & 2Y_2 \\ 2Y_1 & Y_2 - Y_1 - Y(\omega) \end{bmatrix} \quad \text{(Eq. 17)}$$

where $Y_i=1/Z_i$ and $Y(\omega)$ is the complex admittance of the combined resistor, capacitor and inductor, $$Y(\omega) = \frac{\Lambda/\omega}{R_G - i\omega L_G} - i\omega C \quad \text{(Eq. 18)}$$

For waves incident from a region 1, the reflection, transmission and absorption are calculated to be $$R(\omega) = |S_{11}|^2 = \left|\frac{Y_1 - Y_2 - Y(\omega)}{Y_1 + Y_2 + Y(\omega)}\right|^2 \quad \text{(Eq. 19)}$$

$$T(\omega) = \frac{Y_2}{Y_1}|S_{11}|^2 = \frac{4Y_1 Y_2}{|Y_1 + Y_2 + Y(\omega)|^2} \quad \text{(Eq. 20)}$$

$$A_G(\omega) = 1 - R(\omega) - T(\omega) = \frac{4Y_1 \text{Re}\{Y(\omega)\}}{|Y_1 + Y_2 + Y(\omega)|^2} \quad \text{(Eq. 21)}$$

Resonant Frequency and Linewidth

If there are no input waves applied to the system, the two transmission lines representing regions 1 and 2 may be simply replaced by their equivalent impedance, which results in the simple second-order circuit shown in FIG. 3B. In this circuit model, the power dissipated in $Z_1$ and $Z_2$ represents the radiative loss into regions 1 and 2, respectively, while the power consumed in $R_G$ results in absorption in the two-dimensional material. Applying Kirchoff's laws, the voltage v(t) is found to satisfy the following second-order homogenous differential equation:

$$\ddot{v}(t) + \left[\frac{R_G}{L_G} + \frac{(Y_1+Y_2)}{C}\right]\dot{v}(t) + \left[\frac{\Lambda/w}{L_G C} + \frac{R_G(Y_1+Y_2)}{L_G}\right]v(t) = 0 \quad \text{(Eq. 22)}$$

which describes a damped harmonic oscillator. In the limit of low-damping, the resonant frequency (or plasmon frequency) is $$\omega_0 = \sqrt{\frac{\Lambda/w}{L_G C}} \quad \text{(Eq. 23)}$$

$$\omega_0 = e\sqrt{v_F\sqrt{\pi}/2\hbar}\sqrt{\frac{\sqrt{n}}{w\epsilon_0 \bar{\epsilon}\ln[2\csc(\pi w/\Lambda)]}} \quad \text{(Eq. 24)}$$

The damping rate describes the linewidth of the plasmon resonance, which is found to be:

$$\Delta\omega = \frac{R_G}{L_G} + \frac{(Y_1+Y_2)}{C} \quad \text{(Eq. 25)}$$

$$\Delta\omega = \Gamma + \frac{\pi}{2\epsilon_0 \bar{\epsilon}\Lambda \ln[2\csc(\pi w/\Lambda)]}(Z_1^{-1} + Z_2^{-1}) \quad \text{(Eq. 26)}$$

Absorbed Power and Impedance Matching

In many applications it is desired to optimize the power that is absorbed in the graphene layer, by appropriately designing or selecting the properties and dimensions of the metal grating and graphene film By maximizing the absorption $A_G$ (Eq. 21) with respect to the complex admittance $Y(\omega)$, the optimal load admittance is found $$Y_{opt}=(Y_1+Y_2)^* \quad \text{(Eq. 27)}$$

Since $Y_1$ and $Y_2$ are real numbers, (Eq. 27) implies that $Y(\omega)$ must be real, which occurs at an optimal frequency that is close to the resonant frequency.

$$\omega_{opt} = \sqrt{\frac{\Lambda/w}{L_G C} - \left(\frac{R_G}{L_G}\right)^2} \quad \text{(Eq. 28)}$$

$$Y(\omega_{opt}) = \frac{R_G}{L_G C} \quad \text{(Eq. 29)}$$

In this case, the condition for maximum power transfer to the graphene layer can be expressed as $$\frac{R_G}{L_G} = \Gamma = (Y_1 + Y_2)/C \quad \text{(Eq. 30)}$$

which means that for maximum on-resonant absorption, the intrinsic material damping $\Gamma$ is equal to the radiation damping.

Under these matched conditions, the lumped circuit may be regarded as impedance matching between two dissimilar media. The maximum fractional absorbed power is $$A_{max} = \frac{Y_1}{(Y_1 + Y_2)} \quad \text{(Eq. 31)}$$

As discussed in previous paragraphs, the maximum on-resonant graphene absorption is achieved when the material scattering rate $\Gamma$ and radiative decay rates are equal, which is equivalent to an impedance matching between two dissimilar media (Andrea Alu, et al., "Input Impedance, Nanocircuit Loading, and Radiation Tuning of Optical Nanoantennas", Phys. Rev. Lett., 101, 043901 (2008) and Constantine A. Balanis, "Antenna Theory analysis and design." (2012)).

For the parameters considered in FIG. 2A, this matching condition occurs when $\Lambda \approx 23w$, which is consistent with FIG. 2C. It is noted that the circuit model can be generalized by including an inductor in series with $C_M$ to describe metal-graphene plasmonic devices coupled to antennas.

In the circuit model, the metal was treated as a perfect conductor. This is a good approximation when metal is gold with Drude conductivity ($\Gamma=3.33\times10^{13}$ rad/s, $\omega_p=1.36\times10^{16}$ rad/s). It is possible to account for the ohmic loss in the metal by adding a resistor in series with $C_M$ in the equivalent circuit model. However, for typical dimensions, frequencies, and conductivities considered herein, the series resistance is calculated to be much smaller than the reactance of the capacitive grid. It is not expected that this equivalent circuit model can be applied at infrared and optical frequencies, where the metallic structure has its own plasmonic behavior which cannot be ignored.

To measure the THz response of metal-contacted plasmons in the subject graphene-based structures, gratings of gold strips 18 have been fabricated on top of epitaxial graphene layer 14 grown on SiC.

An SEM image and side view of the subject device 10 are shown in FIGS. 1A-1B, respectively. To tune the graphene carrier density, the electrostatic gate voltage Vg has been applied using an electrolytic 24 top gate. The incident beam 32 was polarized perpendicular to the gold stripes 18. The transmission (T) and reflection (R) of the metal-graphene grating devices have been simultaneously measured using conventional FTIR spectroscopy.

Figure 4A:
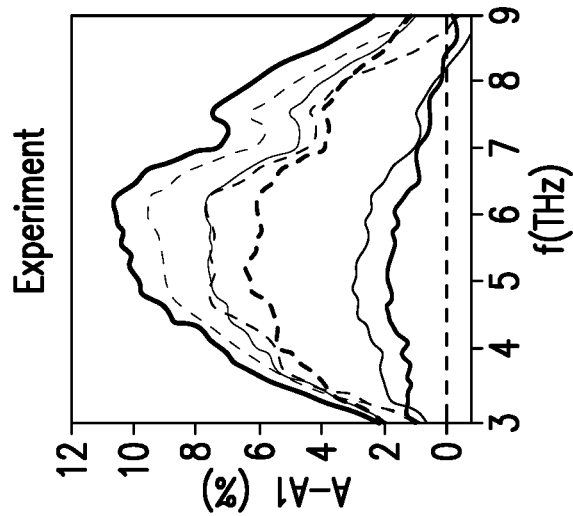
FIG. 4A is a diagram representative of the measured transmission (T) for different graphene carrier densities tuned by applying a gate voltage $V_g$ vs. the frequency.

FIG. 4A shows the measured transmission as a function of frequency for different carrier density levels tuned by application of the gate voltage $V_g$ for a device with $\Lambda=7$ μm and w=350 nm dimensions. A resonant peak was observed in the transmission graph. The plasmonic resonance grows in strength and blue shifts with increasing carrier density.

Figure 4B:
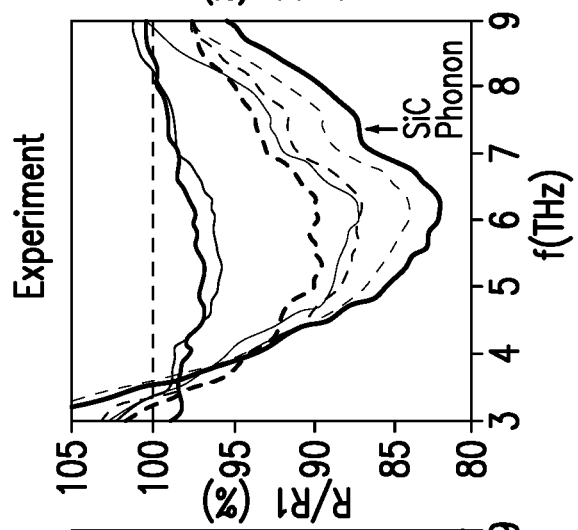
FIG. 4B is a diagram representative of the measured reflection (R) of the subject device for different carrier densities normalized to the lowest carrier density data versus frequency.

In reflection (FIG. 4B) the plasmon resonance exhibits a minimum which also becomes stronger and blue-shifts by increasing the carrier density. In FIG. 4B, the reflection is presented which is normalized to the lowest carrier density data to exhibit clearer the plasmon resonance dip.

Figure 4C:
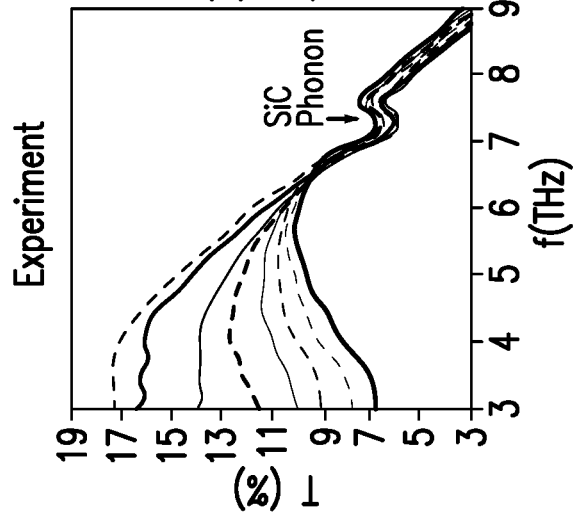
FIG. 4C is a diagram representative of the controlling capabilities of the subject optoelectronic device for the absorption (relative to the lowest carrier density) by electrically tuning the graphene carrier density.

The measured absorption data (A=1−R−T) is presented in FIG. 4C, which shows how the frequency and strength of THz resonant absorption can be controlled by tuning the carrier density with a gate voltage Vg. The carrier density was extracted from the plasmon frequency at each gate voltage and by comparing the experimental spectra to finite element calculations.

Finite element calculations of the same measured quantities presented in FIGS. 4A, 4B and 4C, respectively, are shown in FIGS. 4D, 4E and 4F. The measurement results and the calculations are seen to be in a satisfactory agreement.

In the finite element calculations, Fermi-level pinning at graphene-metal junction was ignored. A constant Fermi level across the graphene channel and zero graphene-metal contact resistance were assumed. The close agreement between experimental results and theory suggest that the Fermi-level pinning and non-zero contact resistance effects are negligible in the devices we studied. However, it is expected that they should have a noticeable effect for narrow graphene channels (<100 nm). (P. A. Khomyakov, et al., "Nonlinear screening of charges induced in graphene by metal contacts" Phys. Rev. B82, 115437 (2010)).

Circuit Model Vs. Finite Element Calculations

Figure 7A:
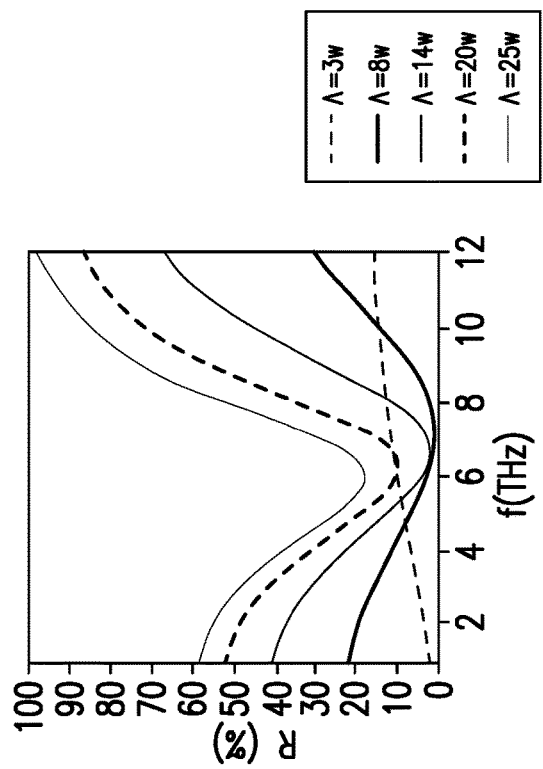
FIGS. 7A and 7B are diagrams representative of Transmission and Reflection, respectively, for different array periods computed by full-wave finite element calculations.
Figure 7B:
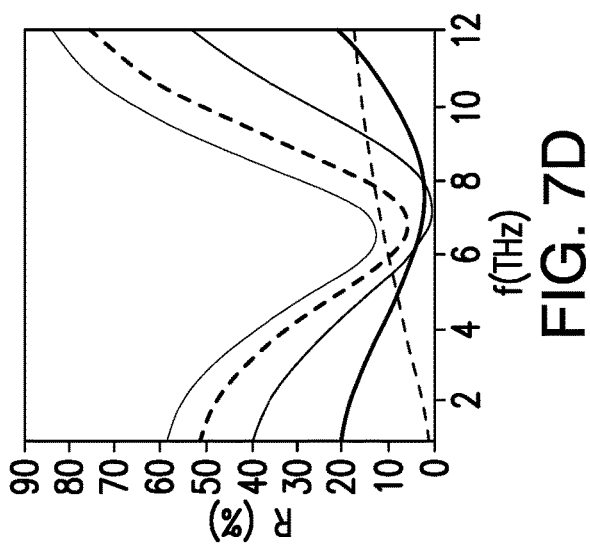
Figure 7C:
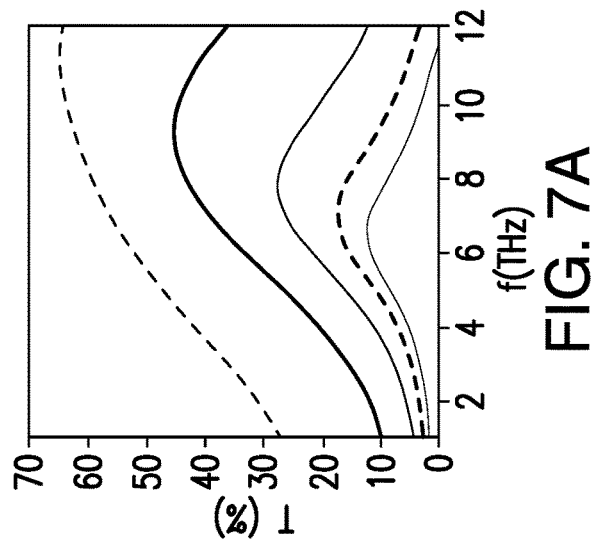
FIGS. 7C and 7D are diagrams of Transmission and Reflection for different periods of the subject structure, respectively, calculated by the circuit model shown in FIG. 3A.
Figure 7D:
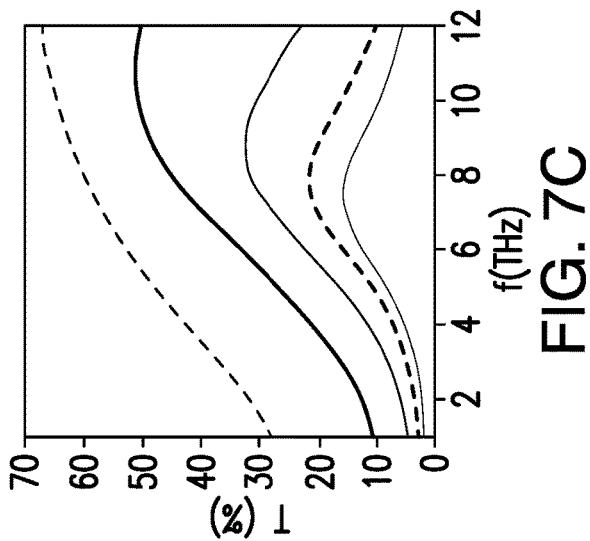

FIGS. 7A-7D show transmission/reflection for different periods computed by full-wave finite element calculations, and FIGS. 7C-7D show transmission/reflection for different periods calculated by the circuit model showed in FIG. 2A, where $\epsilon_1=1$ (air), $\epsilon_2=9$ (SiC), w=0.35 μm, μ=1000 cm$^2$/V·s, n=1.5×10$^{13}$ cm$^{-2}$.

FIGS. 7A-7D compare the transmission (T) and reflection (R) obtained from the full-wave finite element calculation (FIGS. 7A-7B) with the approximated values from circuit model (FIGS. 7C-7D), and a close agreement between the results from circuit model (FIG. 3A) and the exact solution for different grating periods is exhibited.

Plasmon Resonance Shift (Changing w)

Figure 8:
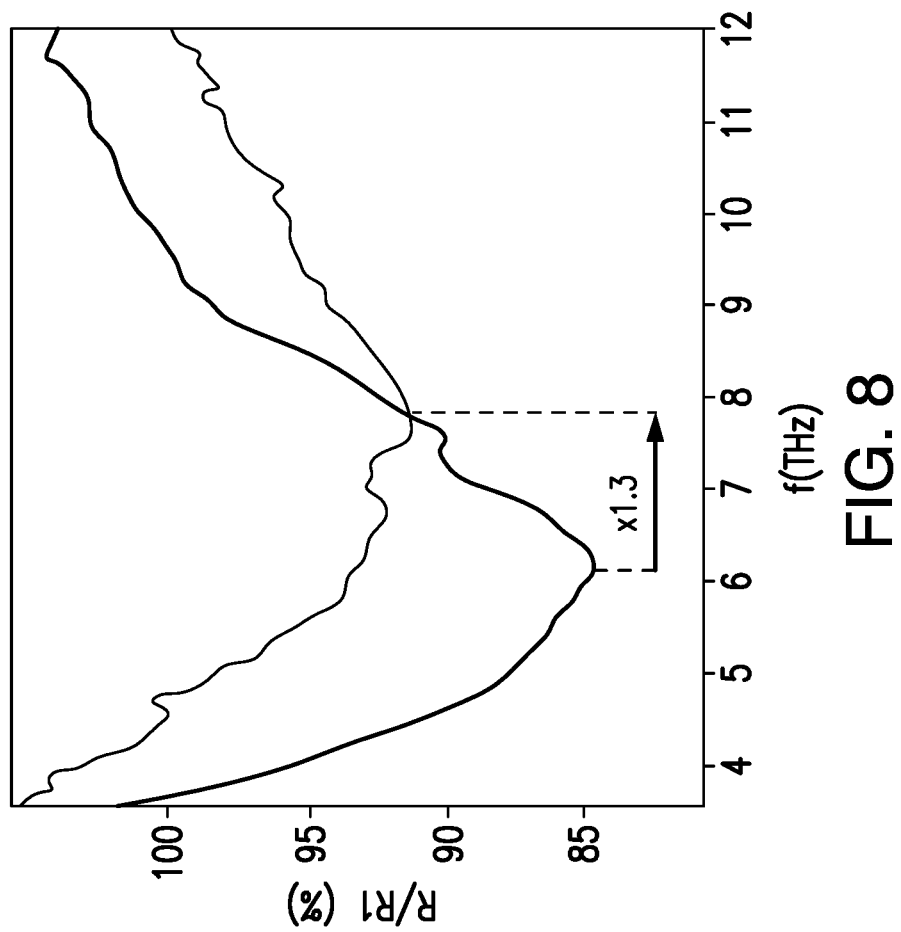
FIG. 8 is a diagram representative of measured normalized reflections for structures having w=200 nm, $\Lambda$=5 μm vs. w=350 nm, $\Lambda$=7 μm at the same carrier density $n=10.3 \times 10^{13}$ $cm^{-2}$ of the graphene material.

FIG. 8 shows the normalized reflection measurement for metal-graphene gratings with two different graphene channel widths (w=350 nm, 200 nm) and for the same carrier density levels. It is seen that the plasmon resonance has shifted to higher frequencies by about 30% ($\sqrt{350nm/200nm}$) as expected from the square-root dispersion relation of graphene plasmon modes.

Similar to the graphene ribbon case with no metal contact (FIG. 2B), plasmon resonance frequency in metal-graphene structures can also be tuned by changing the graphene channel width (Eq. 14). This was confirmed experimentally in the subject structure with a narrower graphene channel (w=200 nm). This data demonstrates that plasmonic resonance can be produced in metal contacted graphene and that they can be tuned and result in strongly enhanced absorption at a selected resonant frequency. These observations show that metal-contacted graphene has great potential for THz optoelectronics, and the tunable hybrid plasmonic modes can be incorporated in graphene-integrated metamaterials, where the metal-graphene plasmon enhances the metamaterial resonance.

It is noted that the metal-graphene plasmonic structure can exhibit near 100% resonant transmission in a high mobility graphene sample, a feature that is useful in THz transmission filters or modulators.

Figure 5C:
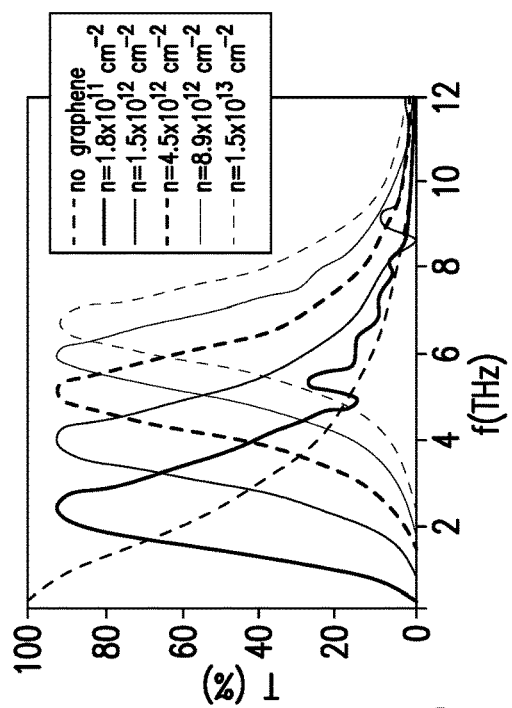
FIG. 5C is a diagram representative of the transmission through the metal-graphene grating for different carrier density levels.

The charges of the transmission of the plasmonic device have been investigated by increasing the graphene mobility. FIG. 5A shows the calculated power transmission spectrum T(f) for a case of w/$\Lambda$=1/20, and for graphene mobilities ranging from 1000 to 100,000 cm$^2$/V·s (n=1.5×10$^{13}$ cm$^{-2}$). The mobility μ of carriers in graphene may be 1000 cm$^2$/V·s for carrier density n=1.5×10$^{13}$ cm$^{-2}$. When the graphene mobility is increased, the graphene absorption decreases, but is replaced by a resonant peak in the transmission that approaches 100% transmission in the limit of high mobility. Again, it is noted that this resonance shifts to zero frequency (low-pass filter response) when the graphene is absent or charge-neutral, showing that the inductive graphene channel is important to support the plasmonic resonance.

Figure 5B:
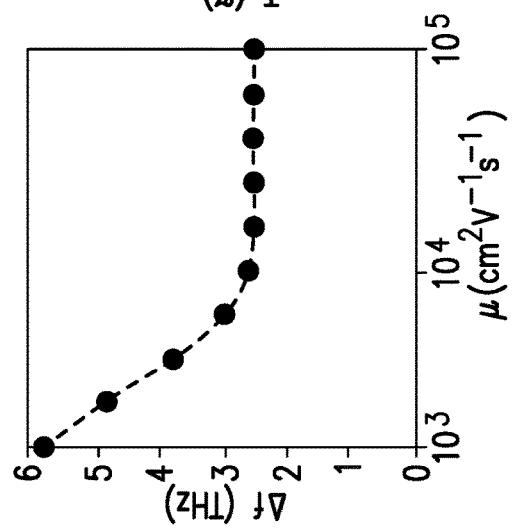
FIG. 5B is a diagram representative of the plasmon resonance width as a function of graphene mobility.

As shown in FIG. 5B, the spectral width of this resonance decreases inversely with the mobility, but reaches a plateau in the limit of high mobility. Above this point, the plasmon linewidth is dominated by radiation damping, and cannot be further reduced by improving the material quality (Eq. 14). In contrast to isolated graphene ribbons (shown in FIG. 2B), the plasmons in metal-contacted graphene are naturally radiative, a feature that can have important consequences in tunable graphene emitters or sensors.

FIG. 5C demonstrates the tunability of the near 100% resonant transmission through changing the graphene carrier density. These results show metal-graphene grating plasmonic device on a high mobility graphene sample is an attractive candidate for tunable THz modulators, or a bandpass filters.

Figure 5D:
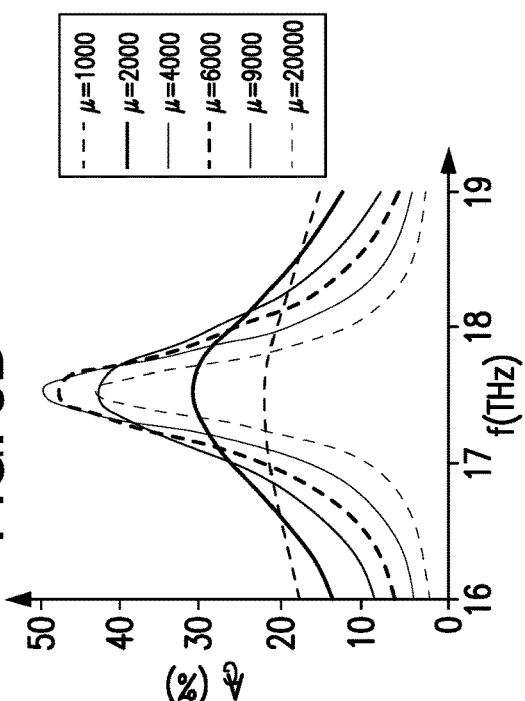
FIG. 5D is a diagram representative of the absorption $A_G$ at the higher order plasmon resonance for different graphene mobilities.
Figure 5A:
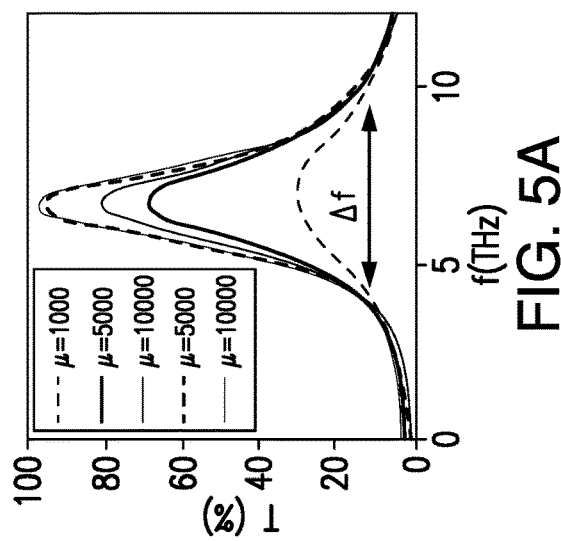
FIG. 5A is a diagram representative of the calculated Transmission through the subject metal-graphene grating for different graphene mobility and $n=1.5 \times 10^{13}$ $cm^{-2}$.

FIG. 5D plots the calculated absorption $A_G(f)$ in the structure with $\Lambda$=2.8 μm under study for six different graphene mobilities ranging from 2,000 to 20,000 cm$^2$/V·s. The absorption at the 3$^{rd}$ order peak approaches the theoretical maximum (50%) for graphene mobility of 9,000 cm$^2$/V·s. This demonstrates that, unlike most plasmonic structures in which higher order modes are weakly coupled to the incident plane-wave, the plasmon modes in the hybrid graphene-metal system can be efficiently excited by appropriately choosing the geometry of the metal contacts and graphene properties.

FIGS. 9A-9B illustrate the sequence of manufacturing steps for fabrication of the subject of the electronic structure 10. As shown in FIG. 9A, a single layer of graphene 14 was formed on the substrate 12 using the Si sublimation process in an Ar (Argon) ambient. The starting substrate 12 was an 8 mm×8 mm semi-insulating 6H—SiC (0001) wafer (resistivity >10$^{10}$ Ω·cm) that was misoriented from the basal plane by proximity 0.1°. The substrate chip was etched in $H_2$ prior to graphene synthesis.

As shown in FIG. 9B, a layer of PMMA photoresist was formed on the graphene layer and patterned using electronic beam lithography (FIG. 9C) followed by Cr/Au (having the thickness of 5 nm/75 nm, respectively) thermal evaporation (as shown in FIG. 9D). Cr was used as the adhesion layer for the enhanced adhering of Au to graphene.

A lift-off process was subsequently performed to remove the residues of PMMA, as shown in FIG. 9E, to form an array of gold strips 18 on the graphene layer 14.

The Au strips 18 were produced 1.5 mm long, and the entire metal grating had the width of 1.5 mm, thus forming the metal grating with an area of approximately 2.25 mm².

To electrically isolate the metal grating from other parts of the graphene/SiC chip, a narrow ribbon (7 μm) was defined by electron-beam lithography using PMMA photoresist as a mask, and oxygen plasma process was conducted to remove the masked areas.

Finally, as shown in FIG. 9F, electrolyte (for example polyethylene oxide/LiClO₄) was drop-cast on the sample as a top gate. The gate voltage was applied between the grating of the device 10 and the electrically isolated part of the SiC graphene substrate.

Far infrared simultaneous transmission/reflection measurements were performed in a Bomem DA-8 FTIR system with a mercury lamp as a source and two 4K silicon composite bolometers as detectors. A polarizer was placed in the beam path to pass only polarization perpendicular to the metal strips. The 1.5×1.5 mm square metal-graphene grating device was mounted on a copper plate with a 1.5 mm diameter aperture. The incident THz beam illuminated the back of the device making an angle about 10° from the normal incidence. One bolometer was located on the transmitted beam path, and another bolometer is located at the reflection side of the experimental setup.

Frequency-domain finite element calculations were performed on the unit cell (shown in FIG. 6) of the metal-graphene grating formed on the top of the SiC substrate (having the refracting index of ~3) with periodic boundary condition. Gold was modeled as a 75 nm thick Drude metal with $\Gamma=3.33\times10^{13}$ rad/s, $\omega_p=1.36\times10^{16}$ rad/s. The electrolyte on the top of the metal grating was modeled as dielectric (refractive index=1.7).

Currents, fields and charge density in graphene and metal were calculated. Transmission and reflection of an incident plane-wave, polarized perpendicular to the metal strips, were also calculated. In the carrier density dependent calculations, a constant scattering rate was assumed for graphene. Mobility was taken to be 1010 cm²/V·s at the carriers density $n=5\times10^{12}$ cm⁻², based on van der Pauw Hall measurements taken on the full graphene layer on SiC sample prior to the processing.

In the finite element calculations, Fermi-level pinning at graphene-metal junction was ignored. A constant Fermi level across the graphene channel and zero graphene-metal contact resistance were assumed. The close agreement between experimental results and theoretical calculations suggest that the Fermi-level pinning and non-zero contact resistance effects are negligible in the devices under study. However, it is expected that they should have a noticeable effect for narrow graphene channels (<100 nm.).

Although this invention has been described in connection with specific forms and embodiments thereof, it will be appreciated that various modifications other than those discussed above may be resorted to without departing from the spirit or scope of the invention as defined in the appended claims. For example, functionally equivalent elements may be substituted for those specifically shown and described, certain features may be used independently of other features, and in certain cases, particular locations of the elements may be reversed or interposed, all without departing from the spirit or scope of the invention as defined in the appended claims.

What is claimed is:

1. A plasmon-enhanced terahertz graphene-based optoelectronic structure, comprising:
   a substrate, and
   hybrid metal-graphene plasmonic elements supporting plasmon resonance fully tunable in a range of terahertz frequencies, said hybrid metal-graphene plasmonic elements being configured by:
   a graphene layer formed on said substrate,
   a patterned conductive layer formed on said graphene layer, said patterned conductive layer forming a first periodic array of a plurality of conductive stripes separated by respective gaps,
   a second periodic array of a plurality of plasmonic graphene channels defined in said graphene layer and embedded in said patterned conductive layer, said plasmonic graphene channels being confined within said respective gaps between said conductive stripes,
   an electrolyte layer positioned atop said patterned conductive layer to envelop and contact said first periodic array of the conductive stripes and said second periodic array of the plasmonic graphene channels,
   a source of an electromagnetic wave of a predetermined wavelength, wherein said electromagnetic wave is incident on said hybrid metal-graphene plasmonic elements, said incident electromagnetic wave being polarized substantially perpendicular to said plasmonic graphene channels,
   wherein each of said plasmonic graphene channels has a width smaller than said predetermined wavelength of the electromagnetic wave, and wherein said hybrid metal-graphene plasmonic elements support the controllable plasmon-enhanced resonance fully tunable in a range of terahertz frequencies.

2. The plasmon-enhanced terahertz graphene-based optoelectronic structure of claim 1, wherein
   said plurality of conductive stripes of said first periodic array are formed in said conductive layer, said conductive stripes extending in a spaced apart relationship each with respect to the other with one of said respective gaps defined between adjacent conductive stripes, and
   each of said plasmonic graphene channels of said second periodic array is confined in said one of said respective gaps between said adjacent conductive stripes, wherein said second periodic array of said plasmonic graphene channels is sandwiched between said substrate and said electrolyte layer, wherein a width of each of said conductive stripes exceeds the width of each said plasmonic graphene channel.

3. The plasmon-enhanced terahertz graphene-based optoelectronic structure of claim 2, wherein the width of said each of plasmonic graphene channels is in a sub-micron range.

4. The plasmon-enhanced terahertz graphene based optoelectronic structure of claim 2, wherein the width of each of said plasmonic graphene channels ranges from 100 nm to few micrometers.

5. The plasmon-enhanced terahertz graphene-based optoelectronic structure of claim 2, wherein said plasmonic graphene channels in said second periodic array thereof extend substantially in parallel each to the other.

6. The plasmon-enhanced terahertz graphene-based optoelectronic structure of claim 2, wherein a ratio $\Lambda/w$ between the width w of each of said plasmonic graphene channels and a period $\Lambda$ of said first array of conductive stripes exceeds 10.

7. The plasmon-enhanced terahertz graphene-based optoelectronic structure of claim 6, wherein said ratio is within the approximate range of 20 to 23.

8. The plasmon-enhanced terahertz graphene-based optoelectronic structure of claim 6, wherein said period Λ of said first array of conductive stripes ranges between 1 μm to 9 μm.

9. The plasmon-enhanced terahertz graphene-based optoelectronic structure of claim 2, wherein said conductive stripes are made from at least one metal.

10. The plasmon-enhanced terahertz graphene-based optoelectronic structure of claim 1, wherein said conductive stripes are sandwiched between said graphene layer and said electrolyte layer.

11. The plasmon-enhanced terahertz graphene-based optoelectronic structure of claim 1, further including a gate terminal coupled to said electrolyte layer, and
a source of a gate voltage $V_g$ applied between said gate terminal and said graphene layer, wherein the controllable plasmon enhanced resonance signal is controlled via a tuning mechanism selected from a group including: an application of the gate voltage $V_g$ between said graphene layer and said electrolyte layer forming a direct contact with the conductive stripes and said plasmonic graphene channels, adjustment of a width of said conductive stripes, adjustment of a width of said plasmonic graphene channels, and combination thereof.

12. The plasmon-enhanced terahertz graphene-based optoelectronic structure of claim 11, wherein, upon application of said gate voltage of the predetermined value $V_g$, said polarized electromagnetic wave excites transverse plasmon at a plasmon resonance resonance in said plasmonic graphene channels, thereby producing a plasmon-enhanced resonance frequency.

13. The plasmon-enhanced terahertz graphene-based optoelectronic structure of claim 12, wherein plasmon resonance frequency and strength of the resonance absorption is controlled by controlling said gate voltage $V_g$ to tune carriers density in said plasmonic graphene channels.

14. The plasmon-enhanced terahertz graphene-based optoelectronic structure of claim 13, wherein a ratio Λ/w of a period Λ of said first array of conductive stripes to the width w of each of said plasmonic graphene channels is approximately 20:1, wherein the mobility μ of carriers in said plasmonic graphene channels is approximately 1,000 $cm^2$/V·s, and the carrier density n in said plasmonic graphene layer is approximately $1.5 \times 10^{13}$ $cm^{-2}$.

15. The plasmon-enhanced terahertz graphene-based optoelectronic structure of claim 13, wherein said mobility μ of carriers in said plasmonic graphene layer is approximately 50,000 $cm^2$/V·s or higher.

16. The plasmon-enhanced terahertz graphene-based optoelectronic structure of claim 12, wherein said plasmon resonance frequency and strength of the resonance absorption is controlled by adjusting the width of said conductive stripes.

17. The plasmon-enhanced terahertz graphene-based optoelectronic structure of claim 12, wherein said plasmon resonance frequency and strength of the resonance absorption is controlled by adjusting the width of said plasmonic graphene channels.

18. The plasmon-enhanced terahertz graphene-based optoelectronic structure of claim 1, wherein said substrate is fabricated from SiC (0001) material.

19. A method of fabrication of a plasmon-enhanced terahertz graphene-based optoelectronic structure comprising:
forming hybrid metal-graphene plasmonic elements capable of supporting plasmon resonance fully tunable in a range of terahertz frequencies, said hybrid metal-graphene plasmonic elements being formed by:
(a) epitaxially forming a single layer of graphene on a SiC substrate, and
(b) forming, on said single layer of graphene, a first periodic array of metallic stripes extending substantially in paralleled relationship one with respect to another with respective gaps defined between neighboring metallic stripes, wherein a second periodic array of graphene channels is sandwiched between said substrate and said first periodic array of metallic stripes, said second periodic array including a plurality of graphene channels defined by areas of said single layer of graphene confined in respective gaps between neighboring metallic stripes,
(c) applying a layer of electrolyte atop of said first periodic array of metallic stripes to envelope and being in a direct contact with said first array of metallic stripes and said second array of graphene channels, wherein said metallic stripes are sandwiched between said electrolyte and said graphene channels,
(d) connecting a gate terminal to said electrolyte layer, and
(e) coupling a source of gate voltage between said gate terminal and said graphene layer,
wherein a ratio of a period Λ of said first periodic array to a width w of each said graphene channel exceeds 10, wherein the width w of said each graphene channel is in sub-micron range, and wherein the mobility μ of carriers in said graphene layer ranges from 1000 to 100,000 $cm^2$/V·s.

20. The method of claim 19, further comprising:
exposing said optoelectronic structure to an incident light polarized in a direction perpendicular to elements selected from a group consisting of said graphene channels and said metallic stripes, to excite transverse plasmon resonance in graphene, and
controlling said gate voltage to tune carrier density of said graphene layer to obtain a plasmon resonance response.

* * * * *